11/13/84 XR 4,482,835

United States Patent [19]

Bar-Cohen et al.

[11] Patent Number: 4,482,835

[45] Date of Patent: Nov. 13, 1984

[54] MULTIPHASE BACKING MATERIALS FOR PIEZOELECTRIC BROADBAND TRANSDUCERS

[75] Inventors: Yoseph Bar-Cohen, Dayton; David A. Stubbs, Waynesville; Wally C. Hoppe, Huber Heights, all of Ohio

[73] Assignee: Systems Research Laboratories, Inc., Dayton, Ohio

[21] Appl. No.: 493,099

[22] Filed: May 9, 1983

[51] Int. Cl.[3] .............................................. H01L 41/08

[52] U.S. Cl. ...................................... 310/327; 310/334

[58] Field of Search ............... 310/326, 327, 334, 336, 310/337; 73/632, 644; 367/162, 165

[56] References Cited

U.S. PATENT DOCUMENTS

Re. 29,785 9/1978 Leschek et al. ..................... 310/327
2,736,823 2/1956 Sheppard et al. ................... 310/327
3,553,501 1/1971 Thill ................................... 310/327

*Primary Examiner*—Mark O. Budd
*Attorney, Agent, or Firm*—Biebel, French & Nauman

[57] ABSTRACT

An acoustical transducer is provided with an acoustically absorbant backing material having an acoustical impedance precisely matching the impedance of the piezoelectric element in the transducer. The backing material is a multiphase mixture of selected materials, such as a low melting point alloy (InPb) and one or more powders having high impedance characteristics (tungsten and copper). The slope of the curve impedance versus volume fraction of the backing components is low, thus allowing the impedance of the material to be precisely controlled. The backing material is preferably electrically conductive and is fuzed to one surface of the piezoelectric element to further improve the output characteristics of the transducer.

7 Claims, 7 Drawing Figures

MULTIPHASE BACKING MATERIALS FOR PIEZOELECTRIC BROADBAND TRANSDUCERS

The U.S. Government has a paid-up license in this invention and the right in limited circumstances to require the patent owner to license others on reasonable terms as provided for by the terms of Contract No. F33615-80-C-5015 awarded by The Department of the Air Force.

BACKGROUND OF THE INVENTION

This invention relates to a backing device for use with piezoelectric crystals, the backing device being a multiphase material having high attenuation characteristics with an impedance closely matched to that of the crystal.

The most effective method of generating and receiving ultrasonic waves is using piezoelectric crystals. An electric impulse applied to such a crystal excites a relatively long duration acoustic-pulse due to the crystals relatively low damping coefficient, namely, a high-Q. For nondestructive evaluation (NDE) applications, such as depth resolution and defect characterization, there is a need for acoustic pulses of as short as possible duration. To reduce the pulse duration a backing material, with an impedance closely matched to the crystal, should be used. For practical purposes, that is, for obtaining a transducer of a small size, the backing material must have as high attenuation as possible to eliminate back reflections.

In the prior art, it is a common practice to use a two-phase mixture consisting of a matrix and a powder filler. See the following references: V. M. Merkulova, "Acoustical Properties of Some Solid Hetergeneous Media at Ultrasonic Frequencies," Sov. Phys.-Acoustics 11, (1) 1965; P. J. Torvik, "Note on the Speed of Sound in Two Phase Mixtures," J. Acoust. Soc. of Amer. 48, (2) 1970; S. Rokhlin, S. Golun and Y. Gefen, "Acoustic Properties of Tungsten-Tin Composites," J. Acous. Soc. of Amer. 69 (5) 1981; V. V. Sazhin, F. I. Isaenko and V. A. Konstantinov, "Mechanical Damper for Ultrasonic Probes," Sov. J. of NDT. 9 (5) p. 505–607 (1973); J. D. Larson and J. G. Leach, "Tungsten-Polyvinyl Chloride Composite Materials—Fabrication and Performance"; and, S. Lees, R. S. Gilmore and P. R. Kranz, "Acoustic Properties of Tungsten-Vinyl Composites," IEEE Trans. on Socis and Ultrasonics, SU-20 (1), 1973.

The matrix usually has a high absorption coefficient, the filler induces strong scattering and combined they provide the required high attenuation. The proper selection of materials and volume fractions allows matching impedances to the crystal.

Tungsten/epoxy is the most widely used backing for commercial transducers due to its potential in providing a large range of impedances (Z) between 3 and $100\times10^5$ g/cm$^2$sec. and its sufficiently high attentuation. The characteristic curve of Impedance vs. Volume Fraction, shown in FIG. 1, shows a very slow increase in impedance for increasing volume fraction of tungsten up to about 0.8, above which a sharp increase occurs. Matching the impedances of crystals such as PZT and $LiNbO_3$, with an impedance of about 30 to $35\times10^5$ g/cm$^2$sec., requires a high volume fraction of tungsten, but this is subject to physical backing limits. Moreover, the steep slope in this range makes reproducibility of backing impedance difficult to obtain. These obstacles are common to all two-phase combinations which serve as potential backing materials.

SUMMARY OF THE INVENTION

In this invention, using selected compositions, and preferably a three-phase (or more) composition reduces the curve steepness, as well as eliminates the need for high volume fraction of fillers. It has been found that such a composite backing material may be closely matched in impedance to the piezoelectric crystal while maintaining high attenuation.

It is, therefore, an object of this invention to provide a composite material exhibiting high absorption characteristics and an acoustical impedance which closely matches that of a piezoelectric transducer to which it is associated.

More specifically, it is an object of this invention to provide a composite material comprising a mixture of InPb, copper and tungsten powders having an acoustical impedance of between 20 and $65\times10^5$ g/cm$^2$sec.

It is a further object of this invention to provide a piezoelectric transducer having improved output pulse characteristics.

It is a still further object of this invention to provide a composite backing material for piezoelectric transducers, which material is electrically conductive, thus providing an electrical connection to one surface of the piezoelectric device.

It is yet another object of this invention to provide a method of assembling a piezoelectric transducer wherein the transducer and the composite backing material are fused together.

These and other objects and advantages of the invention will be apparent from the following description, the accompanying drawings and the appended claims.

DETAILED DESCRIPTION OF THE INVENTION

Figure 1:
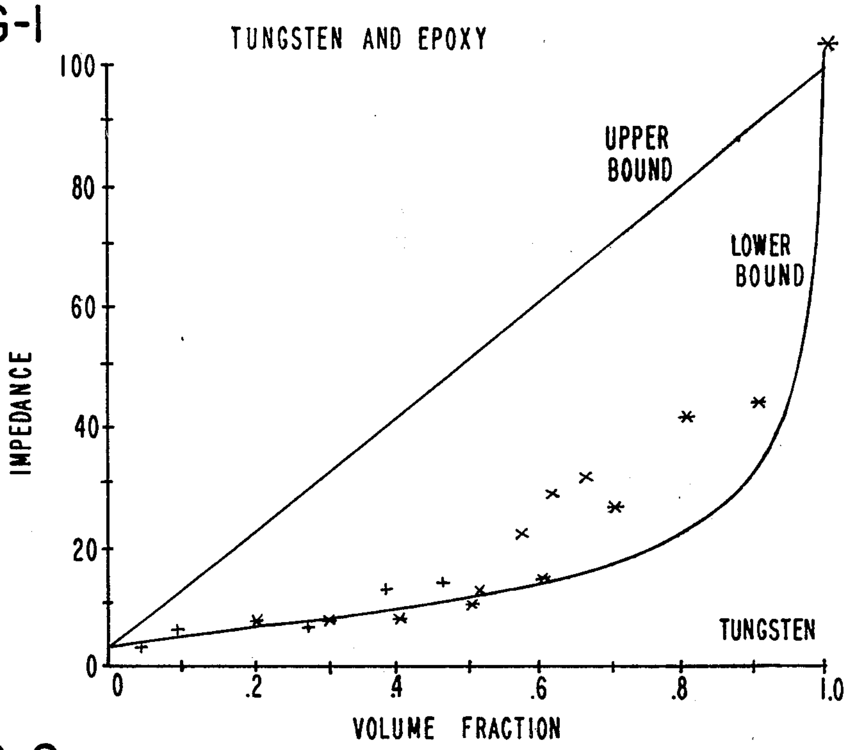
FIG. 1 shows the characteristic Impedance ($\times10^5$ g/cm$^2$sec.) vs. Volume Fraction curve of a two-phase mixture of tungsten and epoxy. The upper and lower impedance bounds are drawn as solid lines. Experimental data from this research and the reported literature are plotted. The impedance units are $\times10^5$ g/cm$^2$sec.

The acoustic impedance of a composite backing material consisting of a matrix and a micro-size particulate can be described using analytical expressions which were developed for mechanical elastic theories. See the following references: K. F. Bainton and M. G. Silk, "Some Factors which Affect the Performance of Ultrasonic Transducers," British J. of NDT, January 1980 and B. Paul, "Prediction of Elastic Constant of Multiphase Materials," Trans. of the Metallurgical Soc. of AIME, 218 p. 36–41, (1960). This approach is feasible when the particle size is much smaller than the acoustic wavelength, namely ka $<<1$, where k=wave number and a=average particle radius. The analytical expressions for the impedance of a multiphase mixture is treated as an extension of the expression for two phases.

The specific acoustic impedance Z of an isotropic homogenious material is defined as $$Z=\rho\cdot V \quad (1)$$

where $\rho$=density and V=acoustic bulk velocity which is expressed as $$V=\left[\frac{E}{\rho}\cdot\frac{(1-\nu)}{(1+\nu)(1-2\nu)}\right]^{\frac{1}{2}} \quad (1a)$$

where E=Young's modulus and $\nu$=Poisson's ratio.

The effective acoustic impedance of a composite, consisting of two different phases, is determined by multiplying the effective density by the effective acoustic velocity. The effective density obeys the rule of mixtures, $$\rho=f_{d1}\rho_1+f_2\rho_2 \quad (2)$$

where $f_i$, is the volume fraction of the i-th constituent, $\rho_i$ is its density, and i=1, 2.

The effective velocity is determined by the effective values for the elastic modulus, E, and Poisson's ratio $\nu$. No rigorous solution which is dependent on particle size, shape, distribution and individual elastic parameters, is feasible for a general particulate composite. Due to this limitation, it is common practice to determine the upper and lower bounds for the required elastic properties. The upper bound has been determined by Paul, "Prediction of Elastic Constant of Multiphase Materials," infra, applying the principle of minimum potential energy to the composite mixture and is given in Eq. 3.

$$E\leq\frac{1-\nu_1+2m(m-2\nu_1)}{1-\nu_1-2\nu_1^2}E_1f_1+\frac{1-\nu_2+2m(m-2\nu_2)}{1-\nu_2-2\nu_2^2}E_2f_2 \quad (3)$$

-continued $$\text{where } m=\frac{\nu_1(1+\nu_2)(1-2\nu_2)f_1E_1+\nu_2(1+\nu_1)(1-2\nu_1)f_2E_2}{(1+\nu_2)(1-2\nu_2)f_1E_1+(1-\nu_1)(1-2\nu_1)f_2E_2} \quad (3a)$$

In the special case where $\nu_1=\nu_2=m$ the upper bound on the elastic modulus (Eq. 3) follows the rule of mixtures. The lower bound, which was determined by Paul using the principle of least work, is given by Eq. 4.

$$E\geq\left[\frac{f_1}{E_1}+\frac{f_2}{E_2}\right]^{-1} \quad (4)$$

The bounds for Poisson's ratio are determined by the bounds on the elastic and shear moduli. The bounds for the shear modulus, $\mu$, of the composite were derived by Paul using the same methods, stated above. These methods yield expressions for the effective $\mu$ having the same form as the expressions for the effective E. Using the bounds on E and $\mu$ the expression for Poisson's ratio is given in Eq. 5.

$$\nu=\frac{E}{2\mu}-1 \quad (5)$$

The upper and lower bounds for the acoustic impedance of a tungsten/epoxy composite are shown as the solid lines in FIG. 1. A collection of data from the literature and this research are also plotted. It can easily been seen that the data follow closely the lower bound of the impedance curve up to 0.6 volume fraction of tungsten. Above 0.6 volume fraction of tungsten the data seems to be somewhat above lower bound, however, the lower bound gives a closer prediction than the upper bound.

Figure 2:
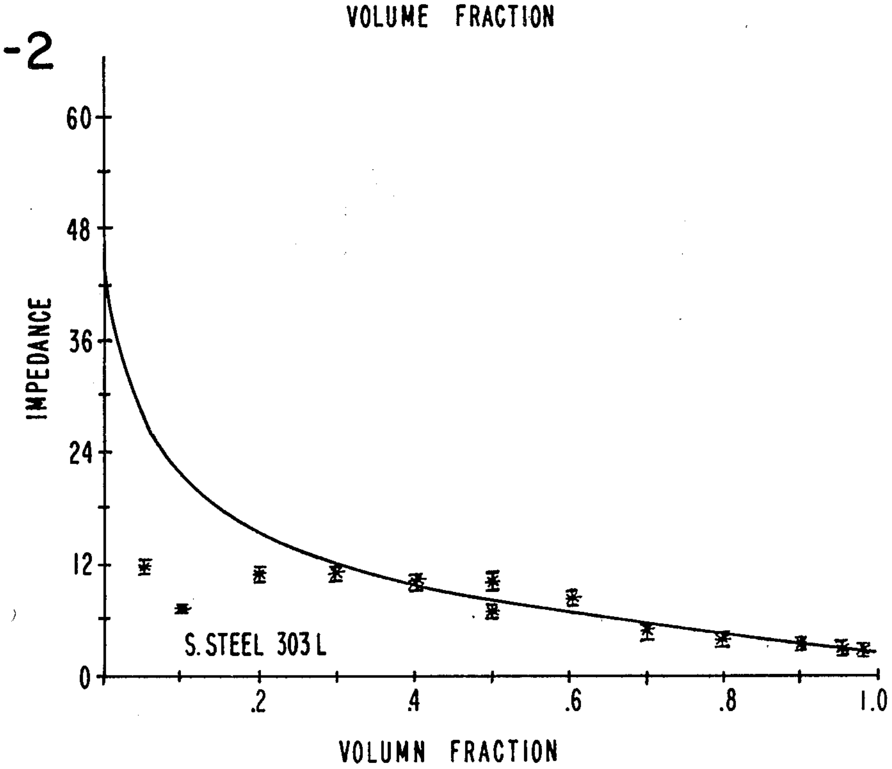
FIG. 2 illustrates a theoretical lower bound impedance curve and data plots for a two-phase mixture of stainless steel 303L and methylmethacrylate.

The simplicity of using the lower bound for impedance combined with the fact that it approximately fits the existing data suggests its use as a simple model to predict the impedance of other particulate composites. A further test of this model was made using stainless steel 303L powder with a particle size less than 150 microns and a matrix of methylmethacrylate. The data and model predictions are shown in FIG. 2. The deviation of the model and data above 0.7 volume fraction of stainless steel is assumed to be due to packing problems.

Using the lower bound model it is seen that to obtain composite backings, with impedances matching PZT or $LiNbO_3$, it is necessary to have a tungsten/epoxy mixture with a volume fraction of tungsten of greater than 0.75. Since the maximum theoretical packing density of a single size spherical particles is 0.74 it is necessary to use different size particles to obtain the desired volume fraction. Further, because of the high slope of the impedance curve in this range, reproducibility of impedance becomes a problem. This also makes fine adjustments of the impedance difficult.

In an attempt to eliminate the problems encountered with a steep slope and high volume fraction filler, the model was used to evaluate the impedance of various mixtures. This goal could partially be obtained using a high impedance matrix. However, evaluation of two-phase theoretical results using practical type of fillers, a high impedance matrix does not seem to be sufficient. Evaluation of the use of more than one type of filler indicates that great advantages are offered in obtaining the above goal. Moreover, it provides a larger degree of freedom in the design of proper matching and attenuation for backing material.

For multiphase mixtures, the acoustic impedance expression based on the lower bounds of the elastic properties has been modified as follows:

$$Z \geq \left[ E \cdot \rho \cdot \frac{2 - \left(\frac{E}{2\mu}\right)}{\left(\frac{E}{2\mu}\right)\left(2 - \frac{E}{\mu}\right)} \right]^{\frac{1}{2}} \quad (6)$$

where $$E = \left[ \sum_{i=1}^{N} \frac{f_i}{E_i} \right]^{-1}, \mu = \left[ \sum_{i=1}^{N} \frac{f_i}{\mu_i} \right]^{-1}, \rho = \sum_{i=1}^{N} f_i \rho_i$$

and, N=the number of constituents.

The applicability of this modified expression for multiphase mixture has been tested experimentally, as follows.

Test samples consisting of various types of filler were made to evaluate the predictions of the model for three-phase composites. For each sample, powders with particle sizes of less than 150 microns were mixed in a V-shaped rotary mixer and then poured into a 1.905 cm inner diameter mold. The powder mixture was heated under a compression force of 4 ksi and under vacuum to 120° C. to allow outgassing the air from the mixture. When the temperature reached 120° C., the compression force was increased to 40 ksi and the mixture allowed to continue to heat to 165° C. The mold was then air cooled while maintaining the compression force on it and the composite was thereafter easily ejected. All samples obtained using this technique were tested visually and were found to be a cohesive solid with evenly distributed constituents.

The impedance of each sample was determined by measuring its density and longitudinal velocity. The velocity measurements were made in a water tank using a broadband transducer in a pulse-echo mode and a Panametrics 5052PR pulser/receiver. The time difference between the echoes from the front and back surfaces was measured using a Tektronix oscilloscope and a model 7D11 digital delay. The resultant velocity measurements had a typical relative error of 5%. To select candidate materials for multiphase mixtures, Section IV-Acoustic Velocity Data from the article by D. E. Chimenti and R. L. Crane entitled "Elastic Wave Propagation through Multilayered Media," AFML-TR-79-4214, April 1980, was used as a guide.

Given the theoretical analysis, various combinations of matrix and fillers have been evaluated using a computer program based on Eq. (6). Graphically, the display of the results for three or more phases requires a more than two dimensional plotting technique which is not practical. To obtain characteristic curves which enable the prediction of the impedance of mixtures, families of curves are drawn with continuous changes of the volume fraction of the two phases, whereas, the third or more constituents are varied in a discrete fashion. Each curve should be interpreted separately, where one phase's volume fraction ($f_3$) is constant and its value is marked to the right of the curve, as can be seen for example in FIGS. 3 or 4. The effect of varying $f_1$, i.e., $(1-f_3-f_2)$ on the characteristic impedance could be read from the x-axis up to the maximum volume fraction of $(1-f_3)$, which is equal to $f_1+f_2$.

Figure 3:
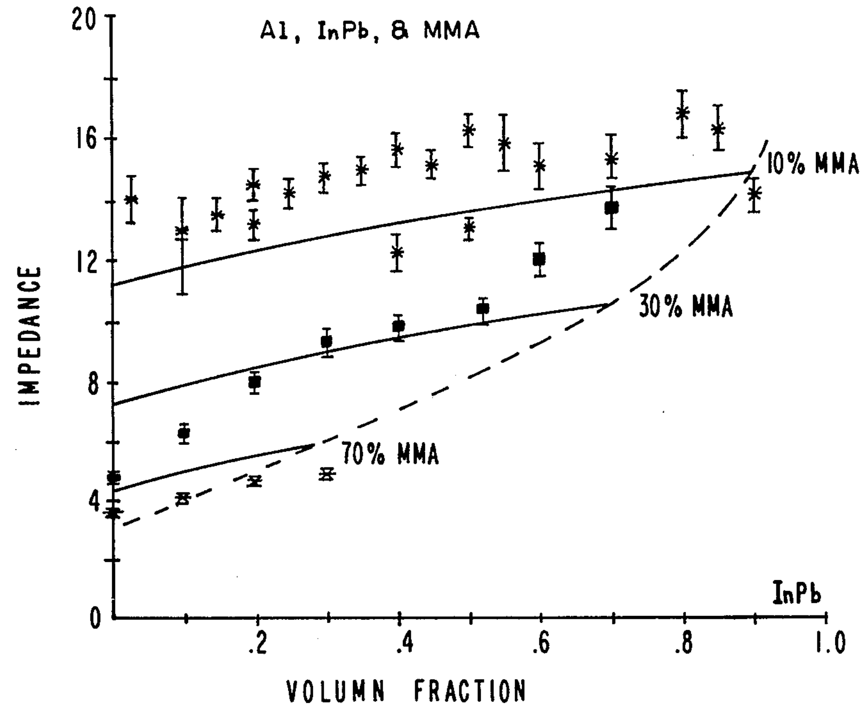
In FIG. 3, a set of theoretical curves and the corresponding experimental data for three-phase mixtures of aluminum, InPb50—50 solder, and methylmethacrylate are shown. The three solid lines represent 0.1, 0.3 and 0.7 volume fractions of the matrix methylmethacrylate and the x-axis represents the volume fraction of the InPb. A two-phase impedance curve is shown as a dashed curve for slope comparison.

To verify the theory, a three-phase combination has been made consisting of methylmethacrylate (MMA) as a matrix (melting point of about 149° C.) and two fillers: Solder alloy InPb50—50 particles (less than 44 microns in diameter) and aluminum particles (less than 44 microns in diameter). Experimental results for 0.1, 0.3 and 0.7 volume fractions of MMA show a close agreement with theoretical prediction, as can be seen in FIG. 3. The set of the three curves, on FIG. 3, demonstrates a much lower slope of the data, as compared to the two-phase case of MMA/InPb50—50 (the dashed line). To determine the reproducibility, three samples of each volume fraction of solder, consisting of 0.7 MMA, were prepared. The test results are compared in Table 1 and show a 8.8% average coefficient of variation.

TABLE 1

REPRODUCIBILITY OF IMPEDANCE OF THREE-PHASE MIXTURE (0.70 MMA AND VARYING VOLUME FRACTIONS OF Al and InPb)

| VF of InPb | $Z_{exp}$ | $Z_{ave} \pm \sigma$ | Coefficient of Variation |
|---|---|---|---|
| | ($\times 10^5$ g/cm$^2$sec) | | $\sigma/Z_{AVE}$ |
| 0.00 | 3.45 ± 0.15 | 3.57 ± 0.13 | 0.04 |
| | 3.60 ± 0.16 | | |
| | 3.65 ± 0.16 | | |
| 0.10 | 3.82 ± 0.14 | 4.04 ± 0.27 | 0.07 |
| | 4.02 ± 0.15 | | |
| | 4.27 ± 0.17 | | |
| 0.20 | 3.59 ± 0.10 | 4.26 ± 0.76 | 0.18 |
| | 4.54 ± 0.15 | | |
| | 4.64 ± 0.16 | | |
| 0.30 | 4.83 ± 0.15 | 5.01 ± 0.31 | 0.06 |
| | 4.93 ± 0.15 | | |
| | 5.28 ± 0.18 | | |

Once the feasibility of reducing the steepness of the curve had been demonstrated, efforts were dedicated to obtain a high impedance mixture in the range of 30 to $35\times10^5$ g/cm$^2$sec. A study of the acoustic properties of various polymers (see "Elastic Wave Propagation through Multilayered Media," infra) revealed none with an impedance greater than $3.75\times10^5$ g/cm$^2$sec. Metals such as Sn, Pb or Cu might be used as a matrix, but packing and cohesion problems occur (see "Acoustic Properties of Tungsten-Tin Composites," infra).

A low melting point solder alloy, such as InPb-50—50, was found to meet the requirements for a suitable matrix. InPb50—50 also wets well to the gold plating formed on the piezoelectric transducers. This alloy has an impedance of approximately $20\times10^5$ g/cm$^2$sec., a melting point of about 190° C., and is available in particulate from of less than 44 microns in diameter. This alloy also flows well at temperatures less than its melting point.

Figure 4:
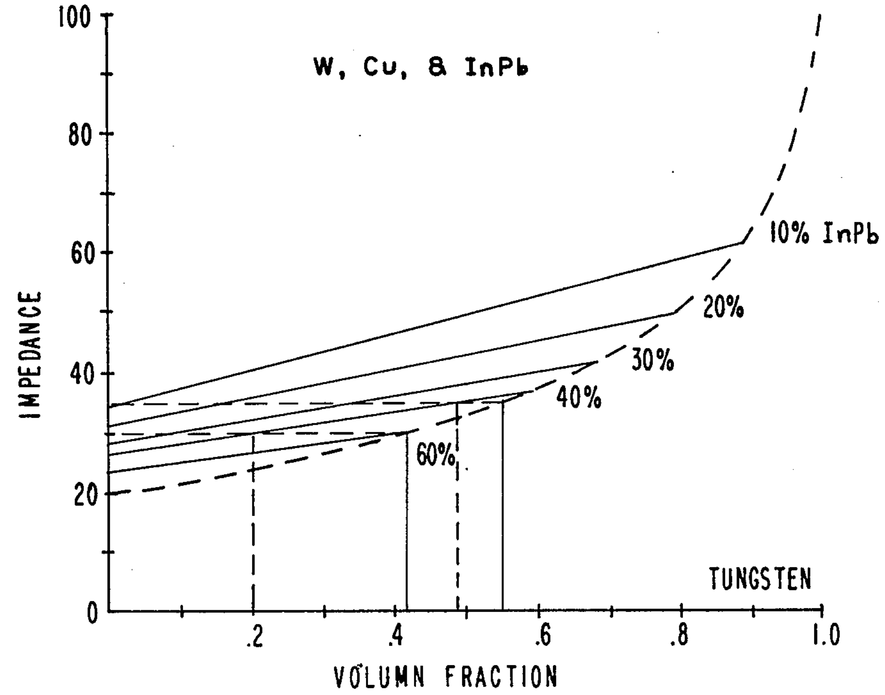
In FIG. 4, theoretical curves for a three-phase mixture of tungsten, copper, and InPb50—50 solder are shown. The dashed, horizontal lines represent selected volume fractions of the matrix InPb. The dashed curve shows the impedance of the two-phase mixture of tungsten and InPb. The set of vertical dashed lines show the range of tungsten that can be used to obtain impedances between 30 and $35\times10^5$ g/cm$^2$sec. using a three-phase mixture with 0.4 volume fraction of InPb matrix. The vertical solid lines slow the range of tungsten volume fraction for two-phase mixture for the same impedance range.

The dashed line in FIG. 4 shows a graph of impedance vs. volume fraction for a mixture of tungsten and this solder. As expected, there is a considerable increase in the overall impedance compared to tungsten/epoxy mixture (c.f. FIG. 1).

Copper, which has an intermediate impedance of $42\times10^5$ g/cm$^2$sec., was chosen as the third constituent and combined with tungsten and solder produces the set of solid lines shown in FIG. 4. Each curve has a lower slope than the two-phase curve in the given impedance range. For any volume fraction of matrix, the addition of the third phase slightly lowers the impedance, but the ability to "fine tune" the impedance is greatly enhanced.

Generally, when using a tungsten/solder mixture, the desired impedance range of 30 to $35\times10^5$ g/cm$^2$sec. is covered by varying the volume fraction of tungsten in the range of 0.42 to 0.55. However, for the three-phase mixture using, for example, a matrix volume fraction of 0.4, this impedance range is covered by varying the volume fraction of tungsten from 0.19 to 0.49, which is more than twice the range of the two-phase mixture.

The attenuation values of the mixtures consisting of tungsten, copper, and InPb50—50, having an impedance in the range of 30 to $35\times10^5$ g/cm$^2$sec., were found to be relatively low. However, this value could be increased by adding attenuative filler such as rubber particles.

Figure 5:
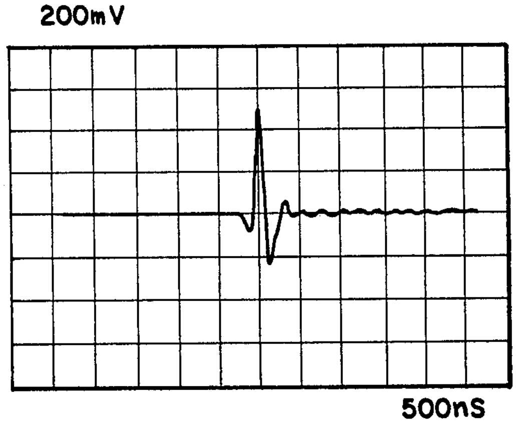
FIG. 5 is an oscilloscope trace showing the pulse-echo response of a 10 MHz, PZT-5A pizoelectric crystal backed with a three-phase mixture of tungsten, copper, and InPb. The time base scale is 500 nsec./div. and the vertical scale is 200mV/div.
Figure 6:
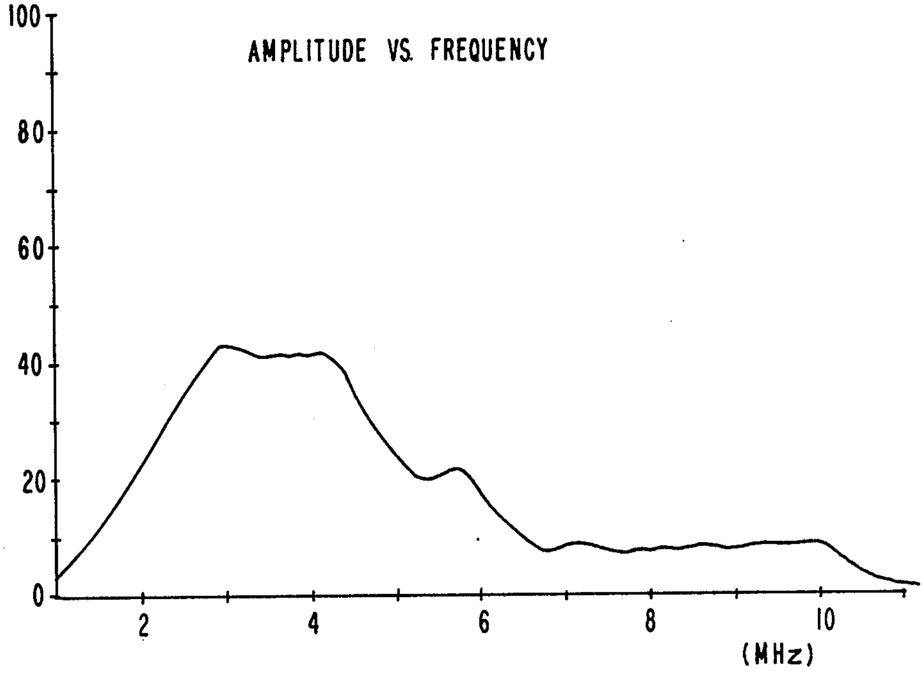
FIG. 6 is a frequency response curve of the transducer referred to in FIG. 5. The vertical scale is in arbitrary units, whereas the x-axis represents the frequency in MHz.

A backing consisting of tungsten/copper solder, having a predicted impedance of $32\times10^5$ g/cm$^2$sec. and experimental value of $32.4\times10^5$ g/cm$^2$sec., has been made. This backing has been pressed on a PZT-5A 10 MHz crystal, recommended for fundamental operation, to produce a transducer. Testing this transducer in a pulse-echo mode demonstrated the potential of the multiphase backing technique as shown in FIG. 5, where the very short duration signal obtained is displayed. The frequency response of the transducer is given in FIG. 6, where its broad band width is demonstrated ($Q=f/\Delta f=1.09$).

Multiphase backing consisting of a solder alloy as a matrix mixed with various types of filler materials provides an effective tool for transducers design. Analytical results which were verified experimentally show that the limitations of conventional two-phase mixtures, namely steep slope and packing problems, are eliminated when using a properly selected combination of three or more phase mixtures.

Figure 7:
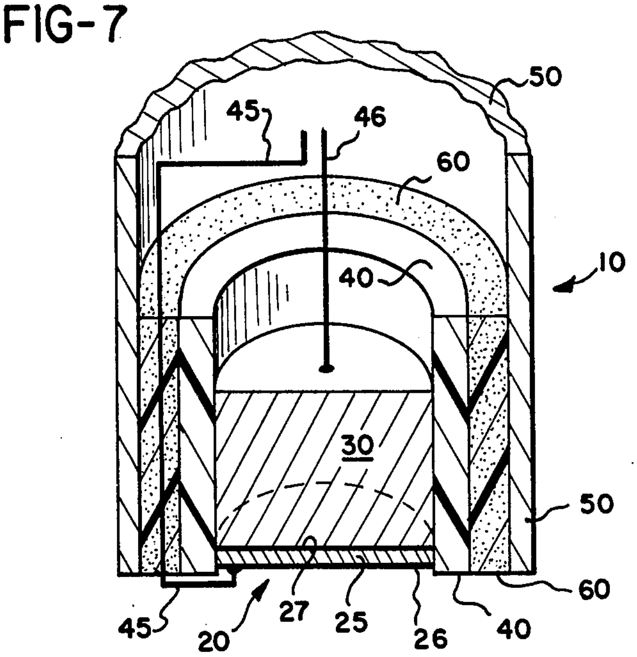
FIG. 7 is a cross-sectional view of a transducer constructed according to this invention.

FIG. 7 shows a transducer 10 constructed according to this invention. A piezoelectric crystal 20 includes a crystal element 25 which is provided with a front gold plated surface 26 and a back gold plated surface 27. Fused to the back surface is the multiphase backing material 30 described above. The crystal 20 and the backing material 30 are preferably contained in a cylindrical housing 40. In one embodiment, this housing 40 is a brass cylinder, in which case the front plating 26 must be insulated therefrom. The housing 40 may also be made of an electrically insulating material, such as Teflon.

An electrical connection is made to the front surface 26 by means of wire 45, and another electrical connection may be made to the back of the backing material 30 by means of wire 46. Both wires 45 and 46 may be soldered or otherwise electrically connected to their respective surfaces.

The transducer assembly is centrally positioned within a stainless steel outer case 50, and the space between the housing 40 and the case 50 may be filled with an absorbant material or potting compound 60, such as epoxy or silicon rubber. Although not shown, the case 50 may be provided with suitable means, such as external threads, for mounting the completed transducer assembly in a fixture or other device which allows the external surface 26 to be placed in acoustical contact with the material to be tested.

One advantage of using the InPb, tungsten, and copper composition for the backing material is that it allows the material to be formed directly onto the crystal surface thereby fusing the crystal and the backing material into one component that are both acoustically and electrically connected. Using a low melting point alloy protects the crystal from damage during construction of the device, and provides a significant improvement in the output pulse characteristics. Using a multiphase composition, particularly with the solder and tungsten mixture as described above, lowers the slope of the impedance curve vs. volume fraction and therefore allows the impedance of the crystal to be matched exactly. Adding a third material, such as copper, flattens the curve even further. Finally, since all of the components used in the backing material are initially in powder form, they may be mixed uniformly, and accurately, therefore providing a backing material having a uniform, predictable and reproduceable impedance characteristic. Using powders to form the backing material also provides a simple and inexpensive means of creating this structure.

While the process and product herein described constitute preferred embodiments of the invention, it is to be understood that the invention is not limited to this precise process and product, and that changes may be made therein without departing from the scope of the invention which is defined in the appended claims.

What is claimed is:

1. In an acoustical transducer comprising a piezoelectric crystal having an electrically conductive surface plated thereon, an absorbant backing material placed against one surface of said crystal for dampening the oscillations thereof, and a housing for supporting the crystal and backing material, the improvement characterized by said backing material comprising a mixture of low melting point metal powder having a low acoustical impedance relative to said crystal to form a matrix into which is evenly distributed one or more metallic powders having a relatively high acoustical impedance, one of which is tungsten, said mixture formed into a cohesive solid having an acoustical impedance precisely matching the impedance of said crystal.

2. The transducer as claimed in claim 1 wherein said backing material is electrically conductive.

3. The transducer as claimed in claim 1 wherein said backing material is fuzed to said crystal plating.

4. The transducer as claimed in claim 1 wherein said backing material is in acoustical and electrical contact with said crystal plating.

5. The transducer of claim 1 wherein said low melting point metal powders have a melting point less than the Curie temperature of said crystal.

6. In an acoustical transducer comprising a piezoelectric crystal having an electrically conductive surface plated thereon, an absorbant backing material placed against one surface of said crystal for dampening the oscillations thereof, and a housing for supporting the crystal and backing material, the improvement characterized by said backing material comprising a mixture of a low melting point powder of InPb alloy having a low acoustical impedance relative to said crystal to form a matrix into which is added one or more powders of tungsten and copper having a high acoustical impedance relative to said crystal to form a cohesive solid having an acoustical impedance closely matching the impedance of said crystal.

7. In an acoustical transducer comprising a piezoelectric crystal having an electrically conductive surface plated thereon, an absorbant backing material placed against one surface of said crystal for dampening the oscillations thereof, and a housing for supporting the crystal and backing material, the improvement characterized by said backing material comprising a mixture of about 50% InPb 50—50 having size of less than 44 microns to form a matrix into which is added about 30% tungsten, having a size of less than 150 microns, and about 20% copper, having a size of less than 44 microns, to form a cohesive solid having an acoustical impedance closely matching the impedance of said crystal.

* * * * *